(12) United States Patent
Luo et al.

(10) Patent No.: US 11,916,098 B2
(45) Date of Patent: Feb. 27, 2024

(54) HIGHLY SYMMETRIC INTEGRATED INDUCTOR

(71) Applicant: REALTEK SEMICONDUCTOR CORPORATION, Hsinchu (TW)

(72) Inventors: Cheng-Wei Luo, Hsinchu (TW); Chieh-Pin Chang, Hsinchu (TW); Kai-Yi Huang, Hsinchu (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 331 days.

(21) Appl. No.: 17/134,573

(22) Filed: Dec. 28, 2020

(65) Prior Publication Data
US 2021/0202687 A1    Jul. 1, 2021

(30) Foreign Application Priority Data
Dec. 31, 2019 (TW) ................. 108148540

(51) Int. Cl.
*H01F 27/28* (2006.01)
*H01L 49/02* (2006.01)

(52) U.S. Cl.
CPC ......... *H01L 28/10* (2013.01); *H01F 27/2804* (2013.01); *H01F 2027/2809* (2013.01)

(58) Field of Classification Search
CPC ... H01L 28/10; H01L 23/645; H01L 23/5227; H01F 27/2804; H01F 2027/2809; H01F 17/0006; H01F 2017/0073
USPC ....................................................... 257/531
See application file for complete search history.

(56) References Cited

U.S. PATENT DOCUMENTS

| | | | |
|---|---|---|---|
| 5,477,204 A * | 12/1995 | Li | H03F 1/565 336/200 |
| 2011/0032067 A1 | 2/2011 | Le Guillou et al. | |
| 2011/0148733 A1* | 6/2011 | Fahs | H01P 5/10 343/859 |
| 2012/0244802 A1* | 9/2012 | Feng | H04B 5/0087 336/225 |
| 2014/0041173 A1* | 2/2014 | Yen | H01F 17/0006 29/25.01 |
| 2015/0035625 A1* | 2/2015 | Ohtomo | H01F 27/29 336/170 |
| 2016/0125995 A1* | 5/2016 | Armanious | H01F 27/2804 336/189 |
| 2017/0098500 A1* | 4/2017 | Yen | H01F 27/29 |

(Continued)

FOREIGN PATENT DOCUMENTS

| | | | | |
|---|---|---|---|---|
| CN | 203746603 U | * | 7/2014 | ............ H01F 27/28 |
| CN | 107731793 A | | 2/2018 | |
| TW | I659437 B | | 5/2019 | |

*Primary Examiner* — Benjamin P Sandvik
(74) *Attorney, Agent, or Firm* — WPAT, P.C

(57) ABSTRACT

An integrated inductor is provided. The integrated inductor includes a first winding and a second winding, and has a first end, a second end, and a node. The first winding utilizes the first end and the node as two ends thereof and includes a first coil and a second coil, which do not overlap. The second winding utilizes the second end and the node as two ends thereof and includes a third coil and a fourth coil, which do not overlap. The first coil and the third coil have an overlapping area, and the second coil and the fourth coil have an overlapping area. The first coil is surrounded by the third coil, and the fourth coil is surrounded by the second coil.

19 Claims, 14 Drawing Sheets

(56) References Cited

U.S. PATENT DOCUMENTS

| | | | |
|---|---|---|---|
| 2018/0102737 A1* | 4/2018 | Wu .................... | H01L 23/5227 |
| 2019/0088734 A1* | 3/2019 | Yen .................... | H01L 23/5227 |
| 2019/0392980 A1* | 12/2019 | Yen .................... | H01F 27/2828 |
| 2020/0098500 A1* | 3/2020 | Terrovitis ............ | H01F 17/0013 |
| 2020/0177151 A1* | 6/2020 | Pierce .................... | H01F 27/29 |
| | | | 336/170 |
| 2020/0251550 A1* | 8/2020 | Yen .................... | H01L 23/5227 |

* cited by examiner

HIGHLY SYMMETRIC INTEGRATED INDUCTOR

BACKGROUND OF THE INVENTION

1. Field of the Invention

The present invention generally relates to integrated inductors, and, more particularly, to highly symmetric integrated inductors.

2. Description of Related Art

Inductors are the main components of a transformer, and inductors and transformers are important components used in the radio frequency integrated circuits to realize various functions, including single-ended to differential signal conversion, signal coupling and impedance matching. As System on Chip (SoC) becomes a trend of integrated circuits, integrated inductors have gradually been substituted for conventional discrete components and widely used in radio frequency integrated circuits. The layout of the integrated inductor plays a significantly important role in the characteristics of the integrated inductor (such as inductance value and quality factor Q, etc.). Thus, it has become an important issue to design a highly symmetric integrated inductor.

SUMMARY OF THE INVENTION

In view of the issues of the prior art, an object of the present invention is to provide integrated inductors, so as to make an improvement to the prior art.

An integrated inductor is provided. The integrated inductor includes a first winding and a second winding and has a first end, a second end and a node. The first winding has two ends which are respectively the first end and the node and includes a first coil and a second coil which do not overlap. The second winding has two ends which are respectively the second end and the node and includes a third coil and a fourth coil which do not overlap. The first coil and the third coil have an overlapping area, and the second coil and the fourth coil have an overlapping area. The integrated inductor is substantially symmetric with respect to a symmetry axis which does not overlap the first coil, the second coil, the third coil and the fourth coil, and the first end and the second end are on different sides of the symmetry axis.

An integrated inductor is also provided. The integrated inductor includes a first winding and a second winding and has a first end, a second end and a node. The first winding has two ends which are respectively the first end and the node and includes a first coil and a second coil which do not overlap. The second winding has two ends which are respectively the second end and the node and includes a third coil and a fourth coil which do not overlap. The first coil and the third coil have an overlapping area, and the second coil and the fourth coil have an overlapping area. The first coil is surrounded by the third coil, and the fourth coil is surrounded by the second coil.

Compared to the conventional technology, the integrated inductors of the present invention are highly symmetric, and, therefore, have better component characteristics and performance.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes integrated inductors. On account of that some or all elements of the integrated inductors could be known, the detail of such elements is omitted provided that such detail has little to do with the features of this disclosure, and that this omission nowhere dissatisfies the specification and enablement requirements. A person having ordinary skill in the art can choose components equivalent to those described in this specification to carry out the present invention, which means that the scope of this invention is not limited to the embodiments in the specification.

Although the terms "first," "second," etc., may be used herein to describe various elements, these elements should not be limited by these terms. Rather, these terms are only used to distinguish one element from another. For example, a first element could be termed a second element, and, similarly, a second element could be termed a first element, without departing from the scope of the embodiments.

Figure 1A:
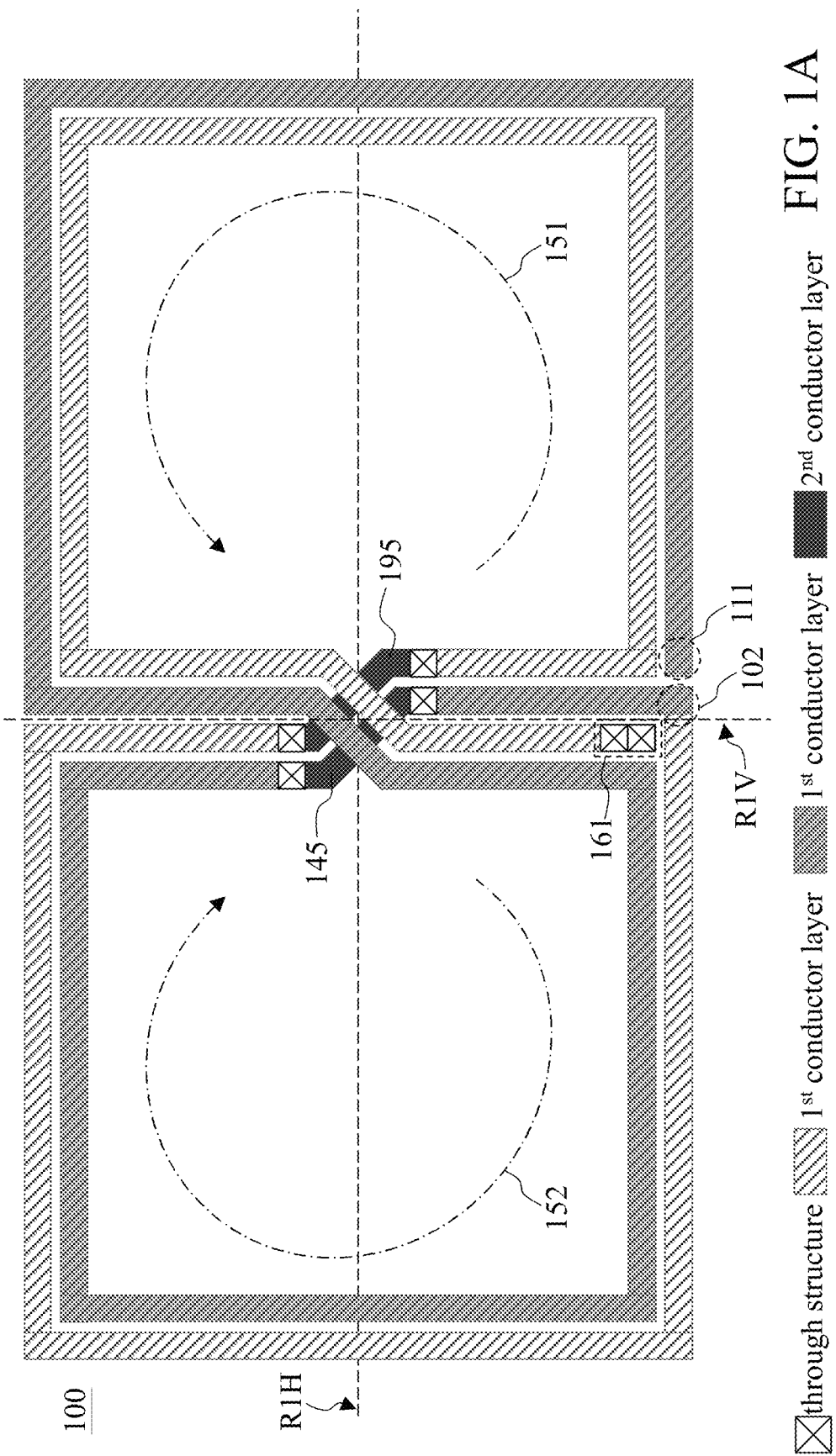
FIGS. 1A to 1C show the structure of an integrated inductor according to an embodiment of the present invention.
Figure 1B:
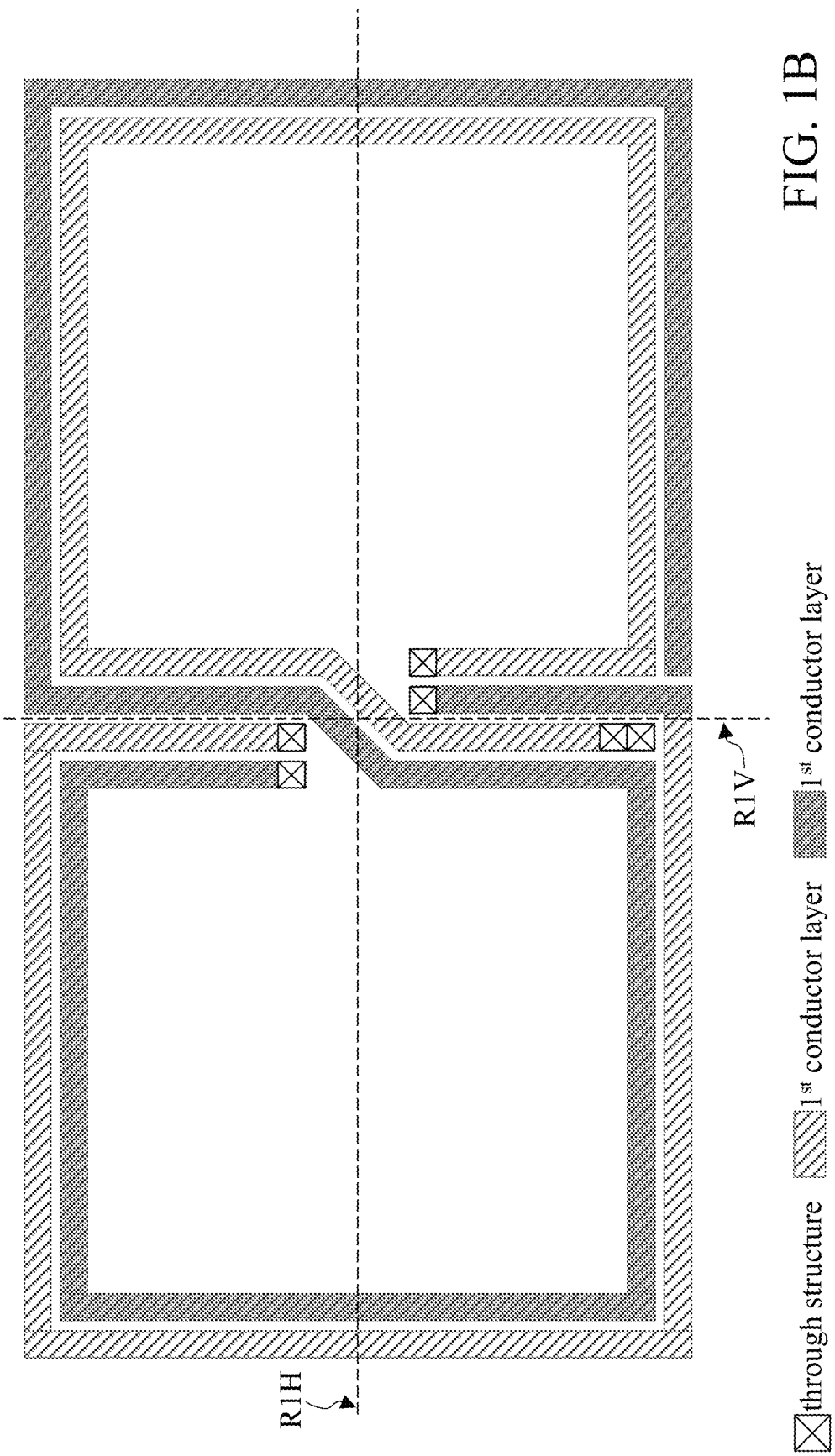
Figure 1C:
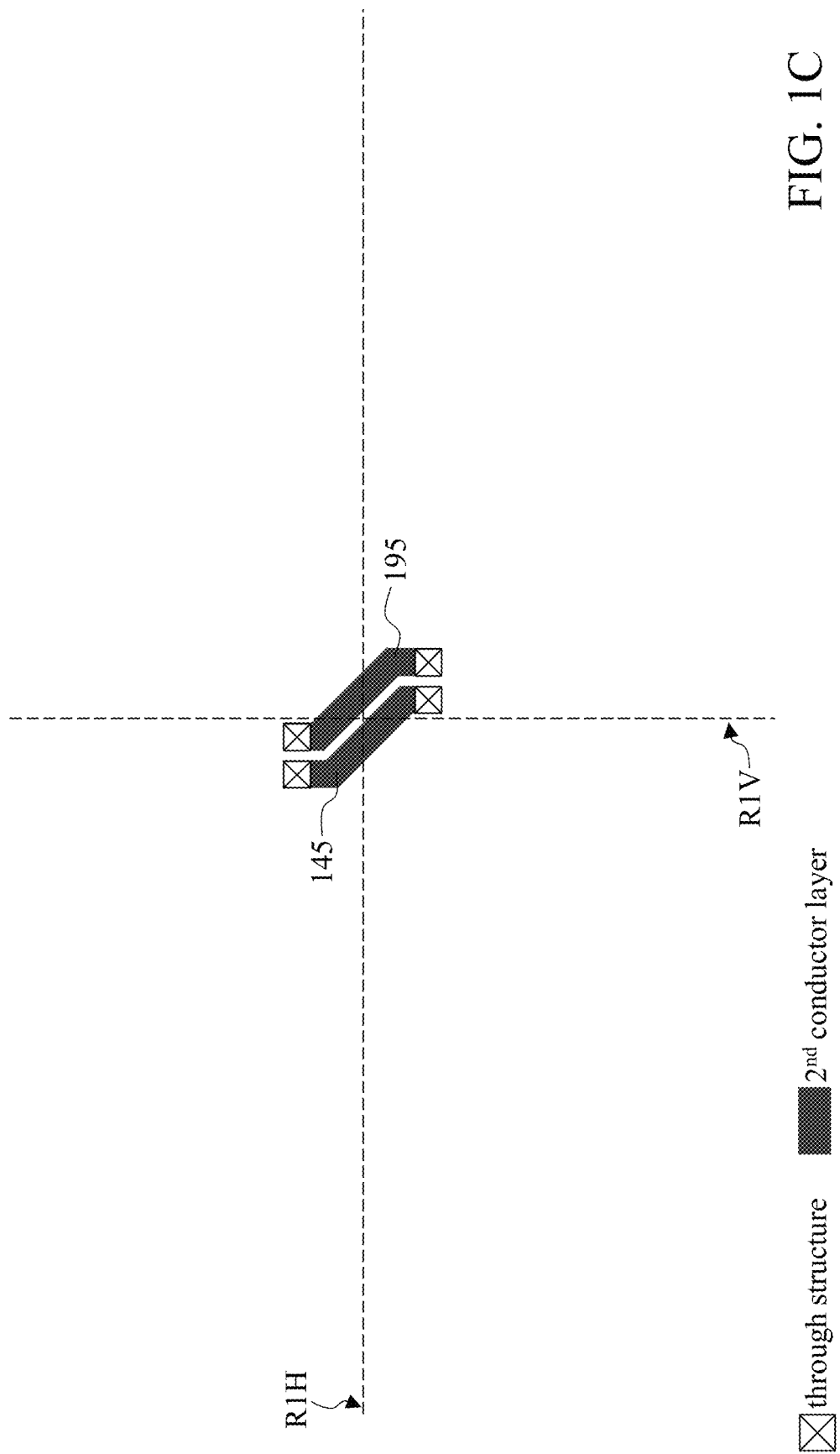

FIGS. 1A to 1C show the structure of an integrated inductor according to an embodiment of the present invention. The integrated inductor 100 is implemented in the first conductor layer and the second conductor layer of a semiconductor structure. In some embodiments, the first conductor layer can be one of an ultra-thick metal (UTM) layer and a re-distribution layer (RDL), and the second conductor layer can be the other of the UTM layer and RDL. FIG. 1A shows the entire structure of the integrated inductor 100, FIG. 1B shows the layout of the integrated inductor 100 in the first conductor layer, and FIG. 1C shows the layout of the integrated inductor 100 in the second conductor layer. Except for the bridging segment 145 and the bridging segment 195, the segments or traces of the integrated inductor 100 are implemented in the first conductor layer. The bridging segment 145 and the bridging segment 195 connect the segments in the first conductor layer via through structures, and the through structures may be a via or a via array.

As shown in FIG. 1A, the integrated inductor 100 is of a highly symmetric structure. More specifically, the integrated inductor 100 is substantially symmetric with respect to both the horizontal symmetry axis R1H and the vertical symmetry axis R1V, which are substantially perpendicular to each other. The end 111 and the end 161 are two ends of the integrated inductor 100, and the numeral 102 denotes a node of the integrated inductor 100. After entering the integrated inductor 100 through the end 111, a signal (i.e., current) passes through the entire integrated inductor 100 in the following order: the outer turn on the right side of the vertical symmetry axis R1V (i.e., most of the dark gray segments)→the inner turn on the left side of the vertical symmetry axis R1V (the dark gray segments)→the bridging segment 145→the dark gray segment between the bridging segment 145 and the node 102→the node 102→the outer turn on the left side of the vertical symmetry axis R1V (i.e., most of the light gray segments)→the bridging segment 195→the inner turn on the right side of the vertical symmetry axis R1V (the light gray segments)→the short light gray segment on the left side of the vertical symmetry axis R1V→the end 161, through which the signal leaves the integrated inductor 100. In other words, the current direction 151 on the right half of the integrated inductor 100 is different from the current direction 152 on the left half of the integrated inductor 100 (one of which being clockwise and the other counterclockwise), making the magnetic field that the integrated inductor 100 generates less radiative. As a result, the integrated inductor 100 can avoid interfering with other components or being interfered with by external magnetic fields.

Figure 2A:
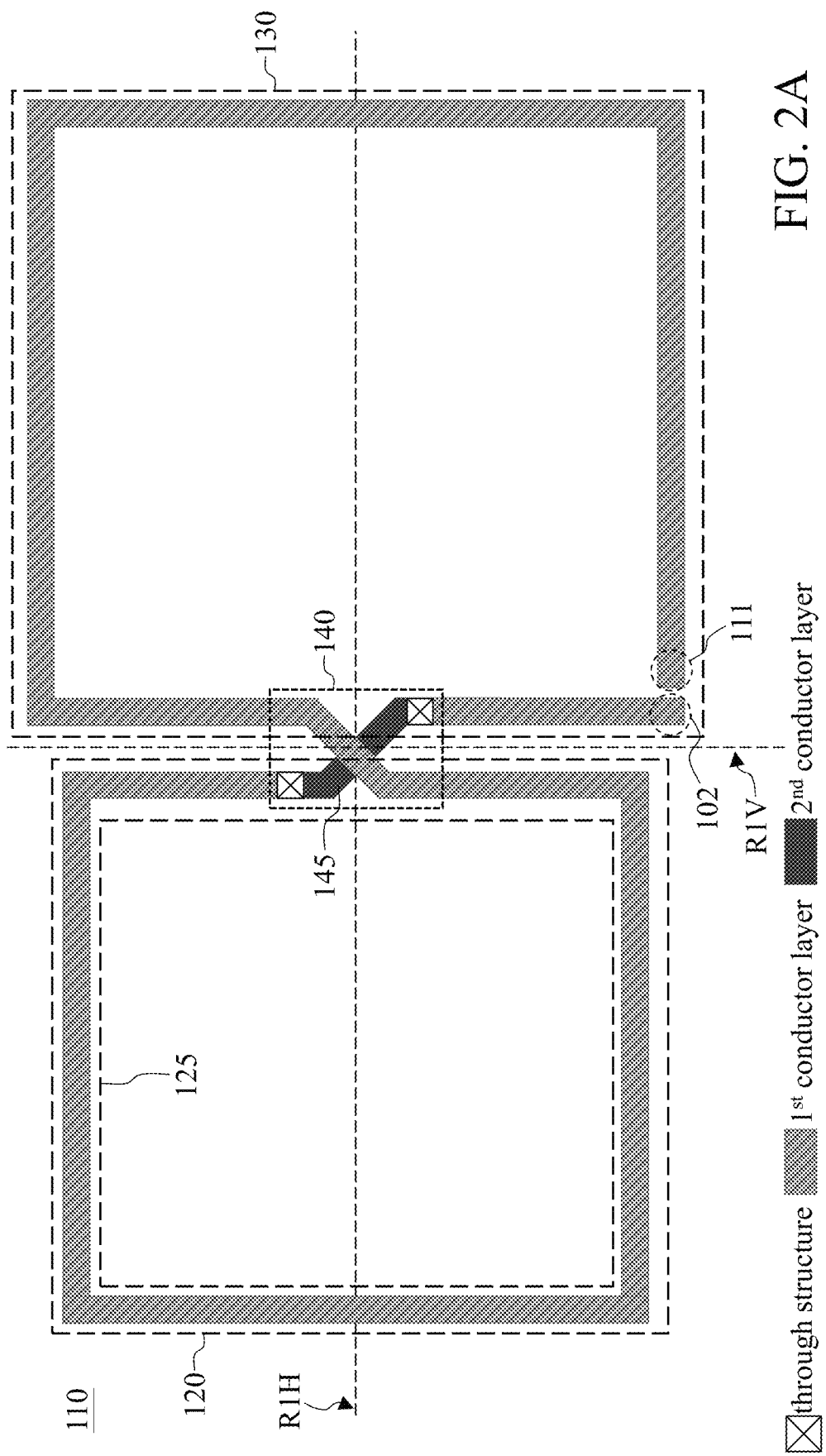
FIGS. 2A to 2B show the two windings of the integrated inductor of FIG. 1.
Figure 2B:
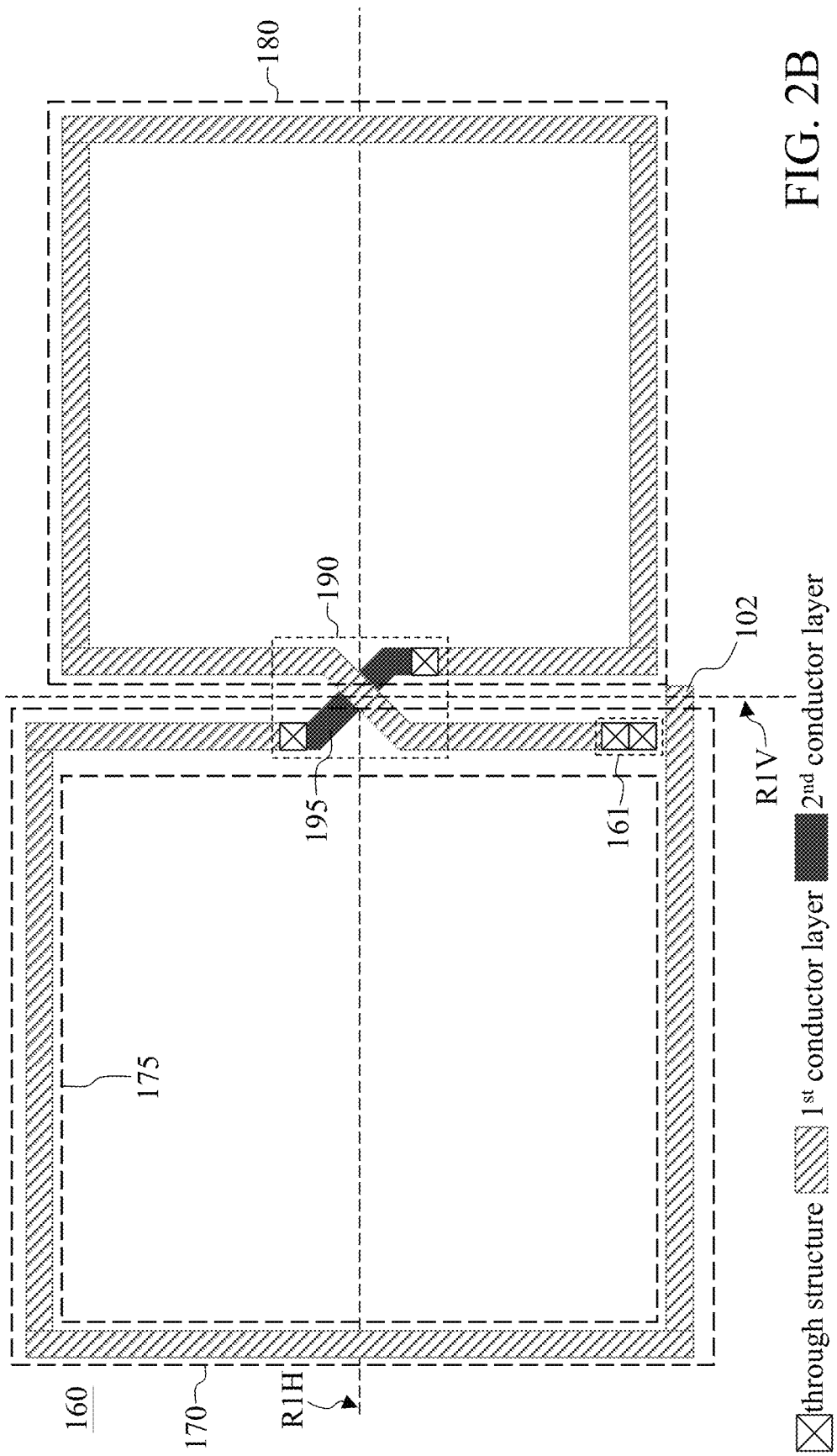

The integrated inductor 100 can be seen as formed by two windings: the winding 110 (FIG. 2A) and the winding 160 (FIG. 2B). The winding 110 includes the dark gray traces and the bridging segment 145 of FIG. 1A, and the winding 160 includes the light gray traces and the bridging segment 195 of FIG. 1A. The end 111 and the node 102 are the two ends of the winding 110, and the end 161 and the node 102 are the two ends of the winding 160. In other words, the winding 110 and the winding 160 are connected through the node 102. In some embodiments, the length of the traces between the node 102 and the end 111 is substantially the same as the length of the traces between the node 102 and the end 161. In other words, the total length of the traces of the winding 110 is substantially the same as the total length of the traces of the winding 160. After entering the integrated inductor 100, a current passes through the whole of one of the winding 110 and the winding 160, enters the other through the node 102, and then passes through the whole of the other. As shown in FIGS. 2A and 2B, because the winding 110 and the winding 160 are substantially equal in length in terms of the traces in the first conductor layer and are substantially equal in length in terms of the traces in the second conductor layer (which means the bridging segment 145 and the bridging segment 195 are substantially equal in length), the winding 110 and the winding 160 are quite symmetric in terms of electrical properties.

The winding 110 includes a coil 120 and a coil 130. The coil 120 and the coil 130 are connected through the crossing structure 140, and the coil 120 and the coil 130 do not overlap. The current direction in the coil 120 is opposite to the current direction in the coil 130 (one of which being clockwise and the other counterclockwise). The winding 110 is symmetric with respect to the horizontal symmetry axis R1H but not symmetric with respect to the vertical symmetry axis R1V. The horizontal symmetry axis R1H overlaps the coil 120 and the coil 130, but the vertical symmetry axis R1V does not overlap the coil 120 and the coil 130.

The winding 160 includes a coil 170 and a coil 180. The coil 170 and the coil 180 are connected through the crossing structure 190, and the coil 170 and the coil 180 do not overlap. The current direction in the coil 170 is opposite to the current direction in the coil 180. The current direction in the coil 170 is the same as the current direction in the coil 120, and the current direction in the coil 180 is the same as the current direction in the coil 130. The winding 160 is symmetric with respect to the horizontal symmetry axis R1H but not symmetric with respect to the vertical symmetry axis R1V. The horizontal symmetry axis R1H overlaps the coil 170 and the coil 180, but the vertical symmetry axis R1V does not overlap the coil 170 and the coil 180.

As shown in FIGS. 2A and 2B, the sizes of the coil 120 and the coil 180 are substantially the same (i.e., the segments or traces of the two are substantially the same in length), and the sizes of the coil 130 and the coil 170 are substantially the same (i.e., the segments or traces of the two are substantially the same in length).

Reference is made to FIGS. 1A, 2A and 2B, the coil 120 and the coil 170 have an overlapping area, and the coil 170 surrounds the coil 120; similarly, the coil 130 and the coil 180 have an overlapping area, and the coil 130 surrounds the coil 180. In other words, the area surrounded or enclosed by the coil 120 (e.g., approximately the area of the dashed box 125) overlaps the area surrounded or enclosed by the coil 170 (e.g., approximately the area of the dashed box 175) Similarly, the area surrounded or enclosed by the coil 130 overlaps the area surrounded or enclosed by the coil 180. The coil 120, the coil 130, the coil 170 and the coil 180 are all of a single-turn structure, making the integrated inductor 100 of a two-turn structure on each side of the vertical symmetry axis R1V.

As shown in FIG. 1A, the end 111, the end 161 and the node 102 are on the same side of the integrated inductor 100 (i.e., on the lower side of the horizontal symmetry axis R1H), and the node 102 is between the end 111 and the end 161. Furthermore, the end 111 and the end 161 are on different sides of the vertical symmetry axis R1V.

Figure 3:
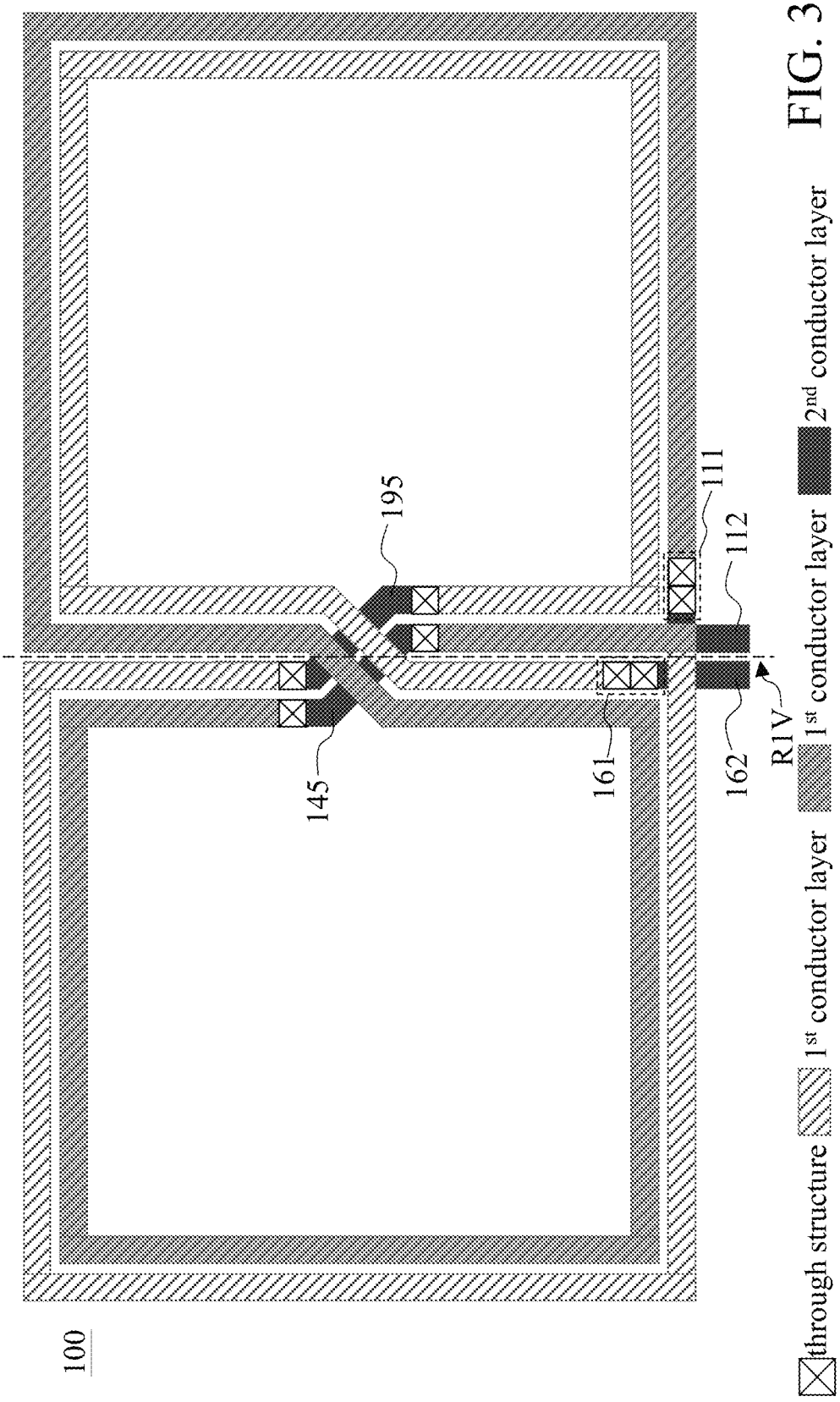
FIG. 3 shows the structure of an integrated inductor according to an embodiment of the present invention.

The through structure on the end 161 is for signal (i.e., current) feed-in or feed-out. In other embodiments, a through structure can also be implemented on the end 111 to make the winding 110 and the winding 160 even more symmetric in terms of electrical properties. As shown in FIG. 3, the end 111 is connected to the extension segment 112 via the through structure(s), the end 161 is connected to the extension segment 162 via the through structure(s), and the current enters (feed-in) or leaves (feed-out) the integrated inductor 100 through the extension segment 112 and the extension segment 162. The extension segment 112 and the extension segment 162 are on different sides of the vertical symmetry axis R1V. As can be seen from FIG. 2B and FIG. 3, the extension segment 162 crosses the coil 170.

Figure 4:
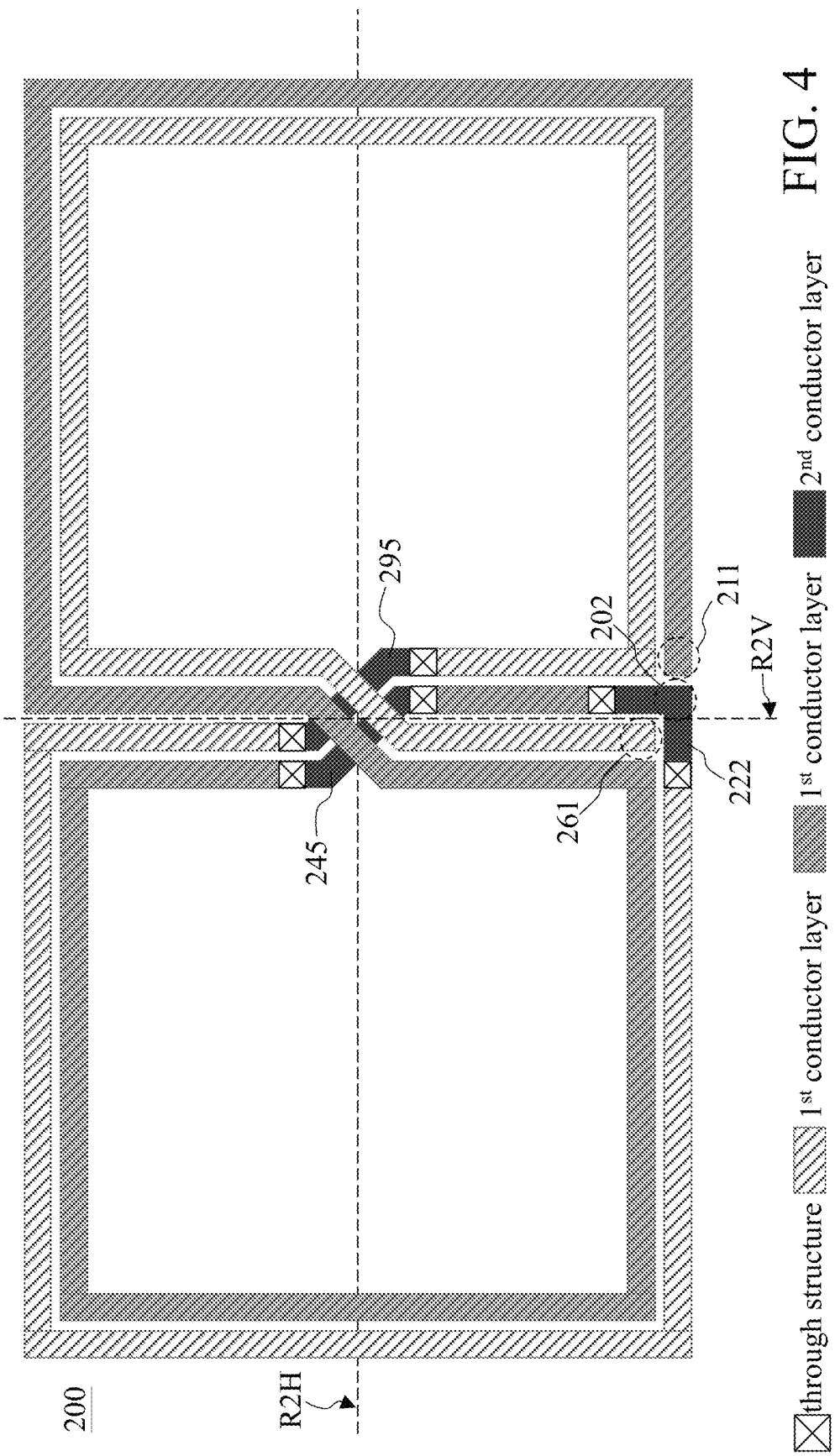
FIG. 4 shows the structure of an integrated inductor according to another embodiment of the invention.

FIG. 4 shows the structure of an integrated inductor according to another embodiment of the present invention. FIG. 4 shows the entire structure of the integrated inductor 200, which is implemented in the first conductor layer and the second conductor layer. Except for the bridging segment 222, the bridging segment 245 and the bridging segment 295, the segments or traces of the integrated inductor 200 are implemented in the first conductor layer.

As shown in FIG. 4, the integrated inductor 200 is substantially symmetric with respect to both the horizontal symmetry axis R2H and the vertical symmetry axis R2V, which are substantially perpendicular to each other. The end 211 and the end 261 are two ends of the integrated inductor 200, and the numeral 202 denotes a node of the integrated inductor 200. The integrated inductor 200 is similar to the integrated inductor 100, except that the two windings of the integrated inductor 200 are connected through a bridging segment 222, and the node 202 is on the bridging segment 222. Therefore, people having ordinary skill in the art can understand other features of the integrated inductor 200 from FIGS. 2A to 2B and related descriptions, and the details shall be omitted herein for brevity. In some embodiments, the end 261 may extend downward to facilitate feed-in or feed-out of signals, in which case, the bridging segment 222 crosses the segment directly connected to the end 261, that is, the bridging segment 222 crosses one of the coils of one of the windings (i.e., the winding made up of the light gray segments) of the integrated inductor 200.

Figure 5:
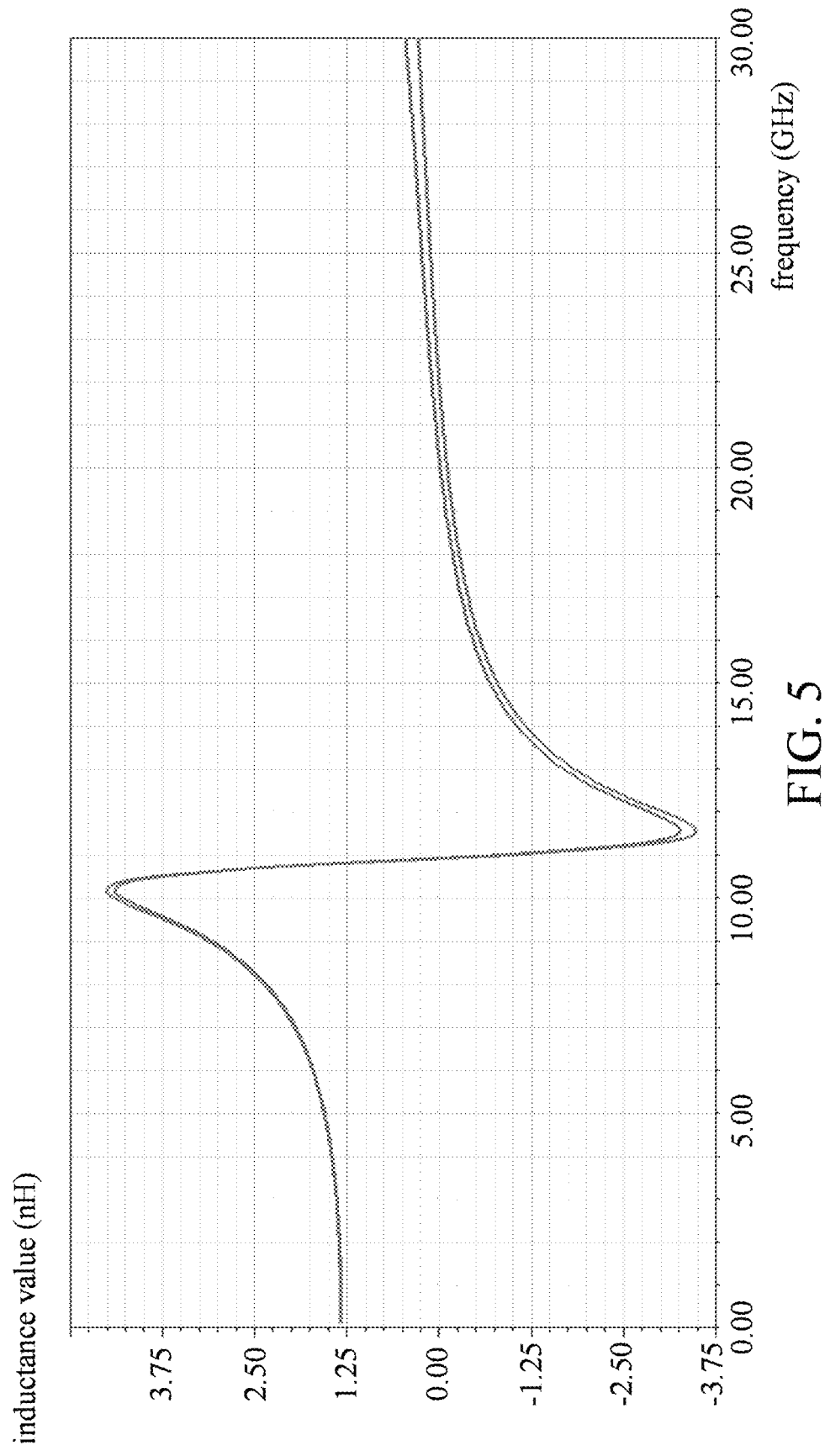
FIG. 5 is the relationship between the inductance value and frequency of the two sub-inductors of the integrated inductor of the present invention.

When the integrated inductor 100 and the integrated inductor 200 are applied to a single-ended signal, no signal enters (feed-in) or leaves (feed-out) the integrated inductor 100 (or 200) through the node 102 (or 202). When the integrated inductor 100 and the integrated inductor 200 are applied to a differential signal, the node 102 and the node 202 serve as the center tap of the integrated inductor 100 and the integrated inductor 200, respectively. The center tap is coupled to or receives the common mode voltage of the differential signal. When the integrated inductor 100 and the integrated inductor 200 are applied to a differential signal, the winding 110 functions as a sub-inductor of the integrated inductor 100, and the winding 160 functions as another sub-inductor of the integrated inductor 100. Similarly, the integrated inductor 200 includes two sub-inductors. Since the integrated inductor 100 and the integrated inductor 200 are extremely symmetric in structure, the two sub-inductors of each of the integrated inductors 100 and 200 are extremely matched in electrical properties. FIG. 5 shows the relationship between the inductance value and frequency of the two sub-inductors. For frequencies under 30 GHz, the inductance values of the two sub-inductors are nearly the same. In other words, the two sub-inductors of the integrated inductor of the present invention are well matched.

Figure 6A:
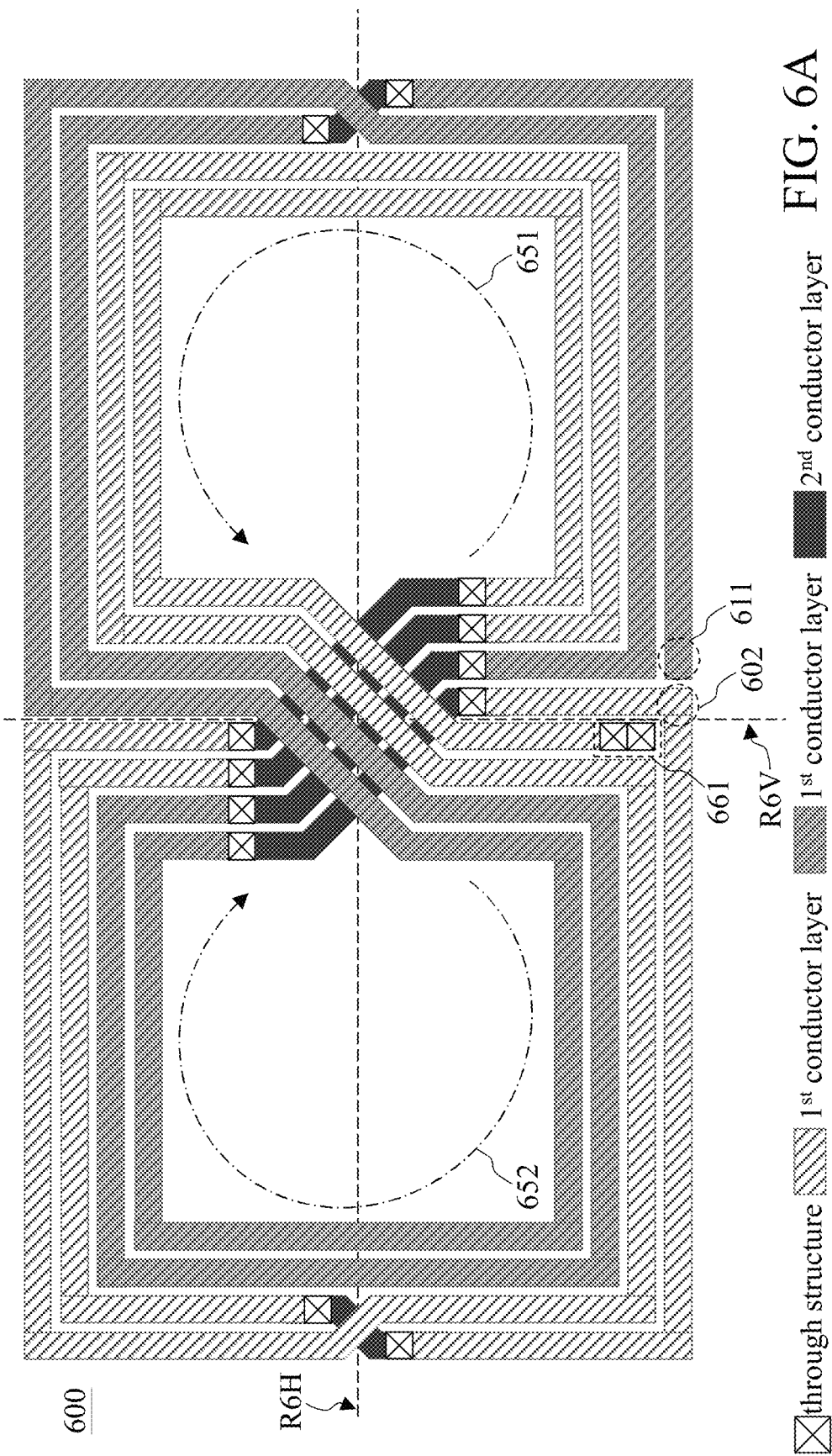
FIGS. 6A to 6C show the structure of an integrated inductor according to another embodiment of the invention.
Figure 6B:
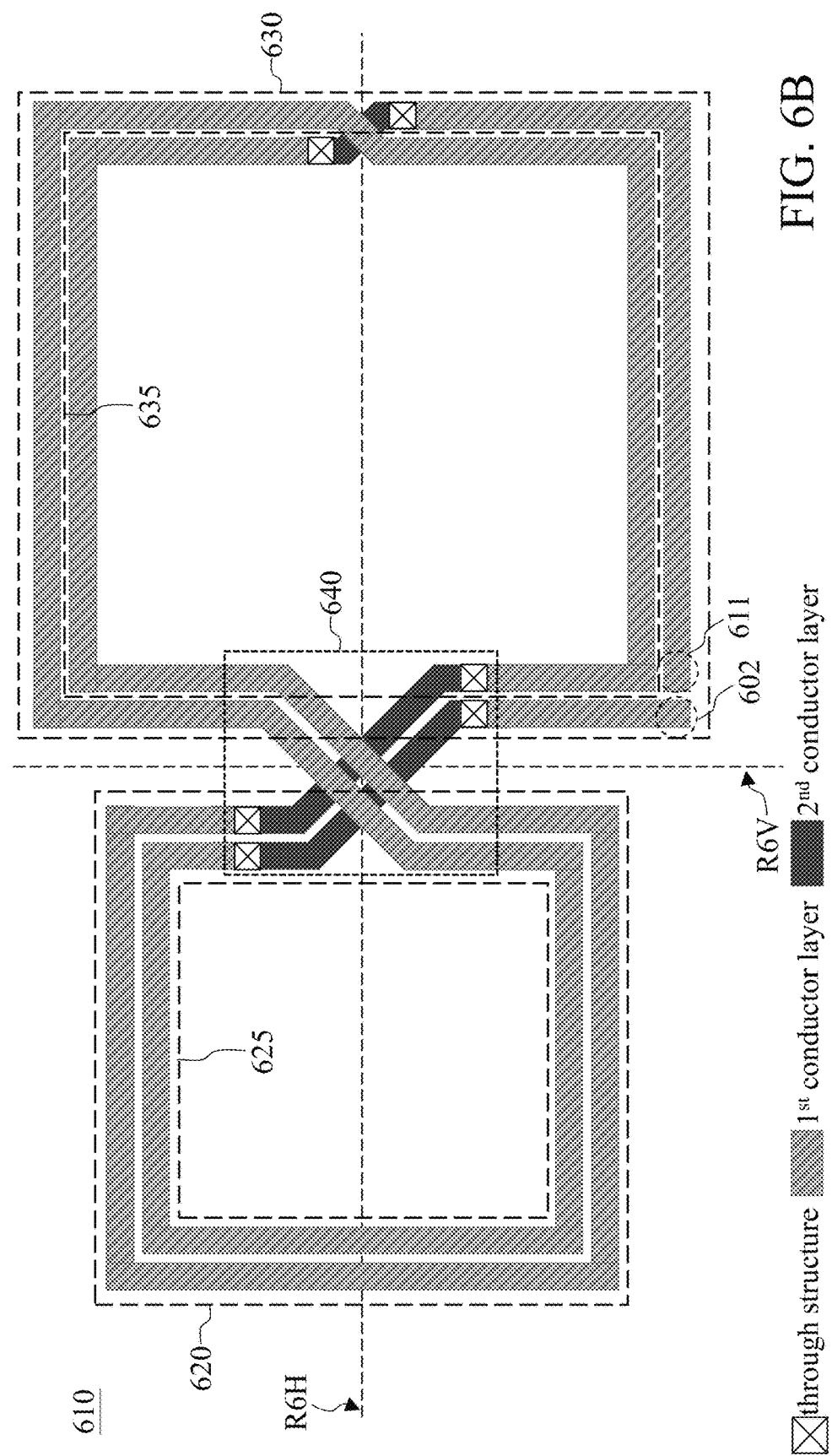
Figure 6C:
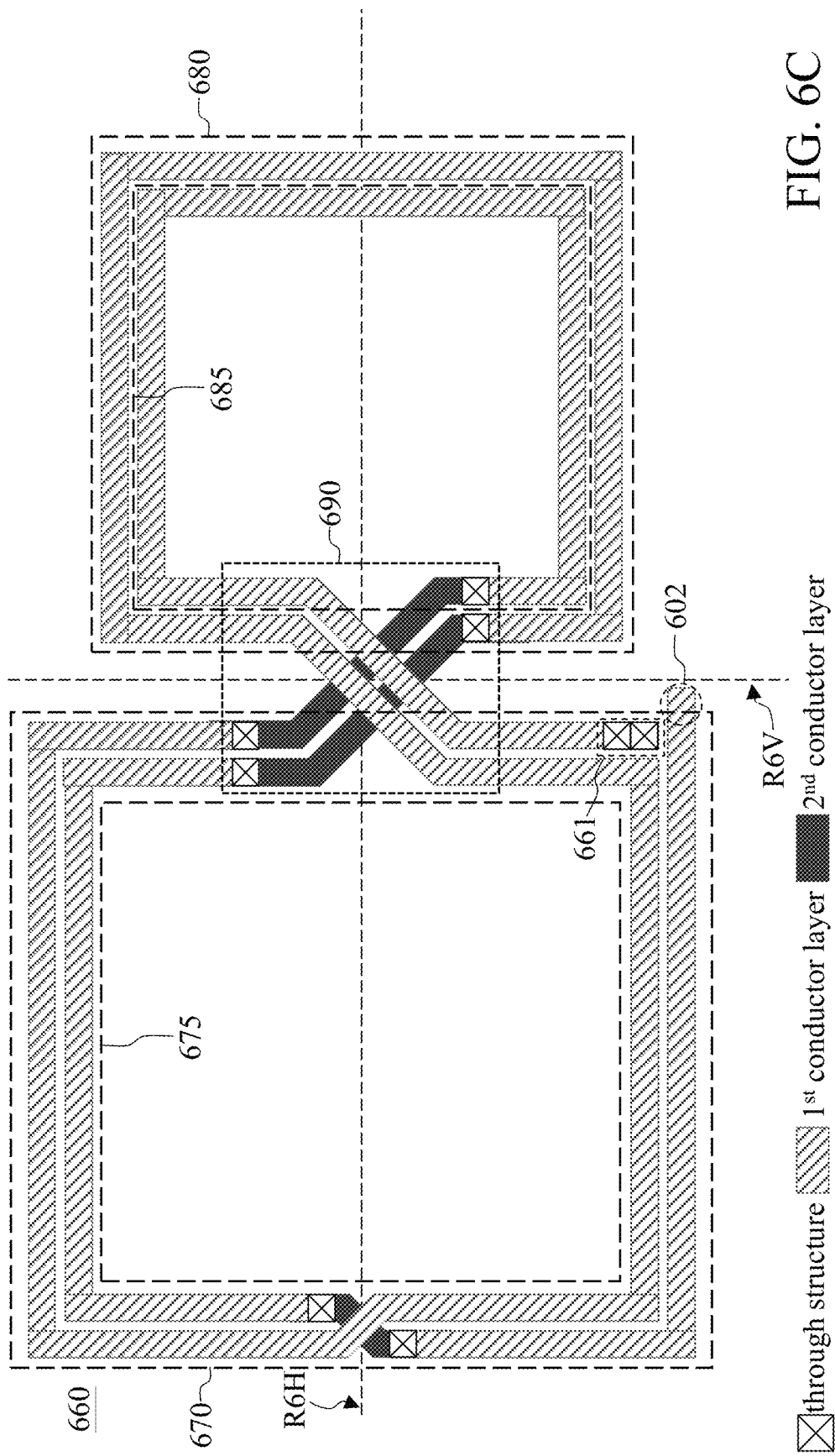

FIGS. 6A to 6C show the structure of an integrated inductor according to another embodiment of the invention. FIG. 6A shows the entire structure of the integrated inductor 600. The integrated inductor 600 is implemented in the first conductor layer and the second conductor layer of a semiconductor structure, and most of the segments or traces of the integrated inductor 600 are implemented in the first conductor layer.

As shown in FIG. 6A, the integrated inductor 600 is of a highly symmetric structure. More specifically, the integrated inductor 600 is substantially symmetric with respect to both the horizontal symmetry axis R6H and the vertical symmetry axis R6V, which are substantially perpendicular to each other. The end 611 and the end 661 are two ends of the integrated inductor 600, and the numeral 602 denotes a node of the integrated inductor 600. After entering the integrated inductor 600 through the end 611, a signal (i.e., current) first passes through the entire winding 610 (as shown in FIG. 6B), through the node 602, through the entire winding 660 (as shown in FIG. 6C), and finally leaves the integrated inductor 600 via the end 661. People having ordinary skill in the art can understand the details of the current path in the integrated inductor 600 from the discussions about the integrated inductor 100, and the details are thus omitted for brevity. In other words, the current direction 651 in the right half of the integrated inductor 600 is different from the current direction 652 in the left half of the integrated inductor 600 (one of which being clockwise and the other counterclockwise).

The integrated inductor 600 can be seen as formed by two windings: the winding 610 (FIG. 6B) and the winding 660 (FIG. 6C). The end 611 and the node 602 are the two ends of the winding 610, and the end 661 and the node 602 are the two ends of the winding 660. In other words, the winding 610 and the winding 660 are connected through the node 602. In some embodiments, the length of the traces between the node 602 and the end 611 is substantially the same as the length of the traces between the node 602 and the end 661. In other words, the total length of the traces of the winding 610 is substantially the same as the total length of the traces of the winding 660. As shown in FIGS. 6B and 6C, because the winding 610 and the winding 660 are substantially equal in length in terms of the traces in the first conductor layer and are substantially equal in length in terms of the traces in the second conductor layer, the winding 610 and the winding 660 are quite symmetric in terms of electrical properties.

The winding 610 includes a coil 620 and a coil 630. The coil 620 and the coil 630 are connected through the crossing structure 640, and the coil 620 and the coil 630 do not overlap. The current direction in the coil 620 is opposite to the current direction in the coil 630. The winding 610 is symmetric with respect to the horizontal symmetry axis R6H but not symmetric with respect to the vertical symmetry axis R6V. The horizontal symmetry axis R6H overlaps the coil 620 and the coil 630, but the vertical symmetry axis R6V does not overlap the coil 620 and the coil 630.

The winding 660 includes a coil 670 and a coil 680. The coil 670 and the coil 680 are connected through the crossing structure 690, and the coil 670 and the coil 680 do not overlap. The current direction in the coil 670 is opposite to the current direction in the coil 680. The current direction in the coil 670 is the same as the current direction in the coil 620, and the current direction in the coil 680 is the same as the current direction in the coil 630. The winding 660 is symmetric with respect to the horizontal symmetry axis R6H but not symmetric with respect to the vertical symmetry axis R6V. The horizontal symmetry axis R6H overlaps the coil 670 and the coil 680, but the vertical symmetry axis R6V does not overlap the coil 670 and the coil 680.

Reference is made to FIGS. 6A, 6B and 6C, the coil 620 and the coil 670 have an overlapping area, and the coil 670 surrounds the coil 620; similarly, the coil 630 and the coil 680 have an overlapping area, and the coil 630 surrounds the coil 680. In other words, the area surrounded or enclosed by the coil 620 (e.g., approximately the area of the dashed box 625) overlaps the area surrounded or enclosed by the coil 670 (e.g., approximately the area of the dashed box 675) Similarly, the area surrounded or enclosed by the coil 630 overlaps the area surrounded or enclosed by the coil 680. The coil 620, the coil 630, the coil 670 and the coil 680 are all of a two-turn structure, making the integrated inductor 600 of a four-turn structure on each side of the vertical symmetry axis R6V. In other embodiments, the coil 620, the coil 630, the coil 670 and the coil 680 may each be a structure of even-numbered turns (four turns, six turns, eight turns, etc.). People having ordinary skill in the art can understand the various embodiments based on the above discussions, so the details of the embodiments of more turns are omitted for brevity.

Reference is made to FIGS. 6A, 6B and 6C. The coil 630 includes a first sub-coil (i.e., the outer turn, formed by the segments outside the dashed box 635) and a second sub-coil (i.e., the inner turn, formed by the segments inside the dashed box 635). The coil 680 includes a third sub-coil (i.e., the outer turn, formed by the segments outside the dashed box 685) and a fourth sub-coil (i.e., the inner turn, formed by the segments inside the dashed box 685). The first sub-coil, the second sub-coil, the third sub-coil and the fourth sub-coil are arranged in sequence from outside to inside. In other words, the outer turn of the coil 680 is surrounded by the inner turn of the coil 630. Similarly, the outer turn of the coil 620 is surrounded by the inner turn of the coil 670.

As shown in FIGS. 6B and 6C, the outer and inner turns of the coil 620 are substantially the same size as the outer and inner turns of the coil 680, respectively, and the outer and inner turns of the coil 630 are substantially the same size as the outer and inner turns of the coil 670, respectively.

As shown in FIG. 6A, the end 611, the end 661 and the node 602 are on the same side of the integrated inductor 600 (i.e., on the lower side of the horizontal symmetry axis R6H), and the node 602 is between the end 611 and the end 661. Furthermore, the end 611 and the end 661 are on different sides of the vertical symmetry axis R6V.

The through structure on the end 661 is for signal (i.e., current) feed-in or feed-out. In other embodiments, a through structure can also be implemented on the end 611 to make the winding 610 and the winding 660 even more symmetric in terms of electrical properties. For more implementation details, please refer to FIG. 3 and its descriptions.

Figure 7A:
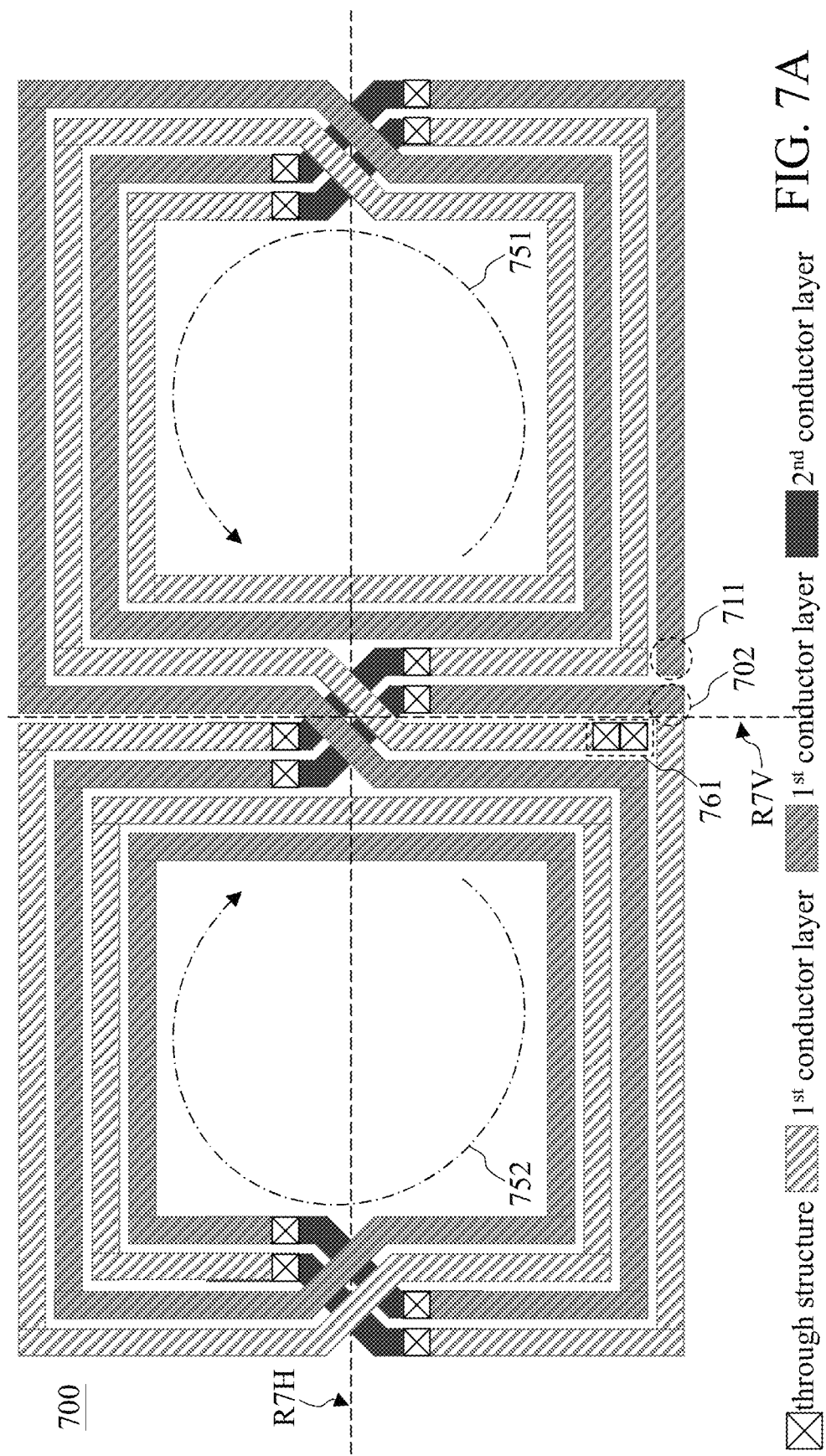
FIGS. 7A to 7C show the structure of an integrated inductor according to another embodiment of the invention.
Figure 7B:
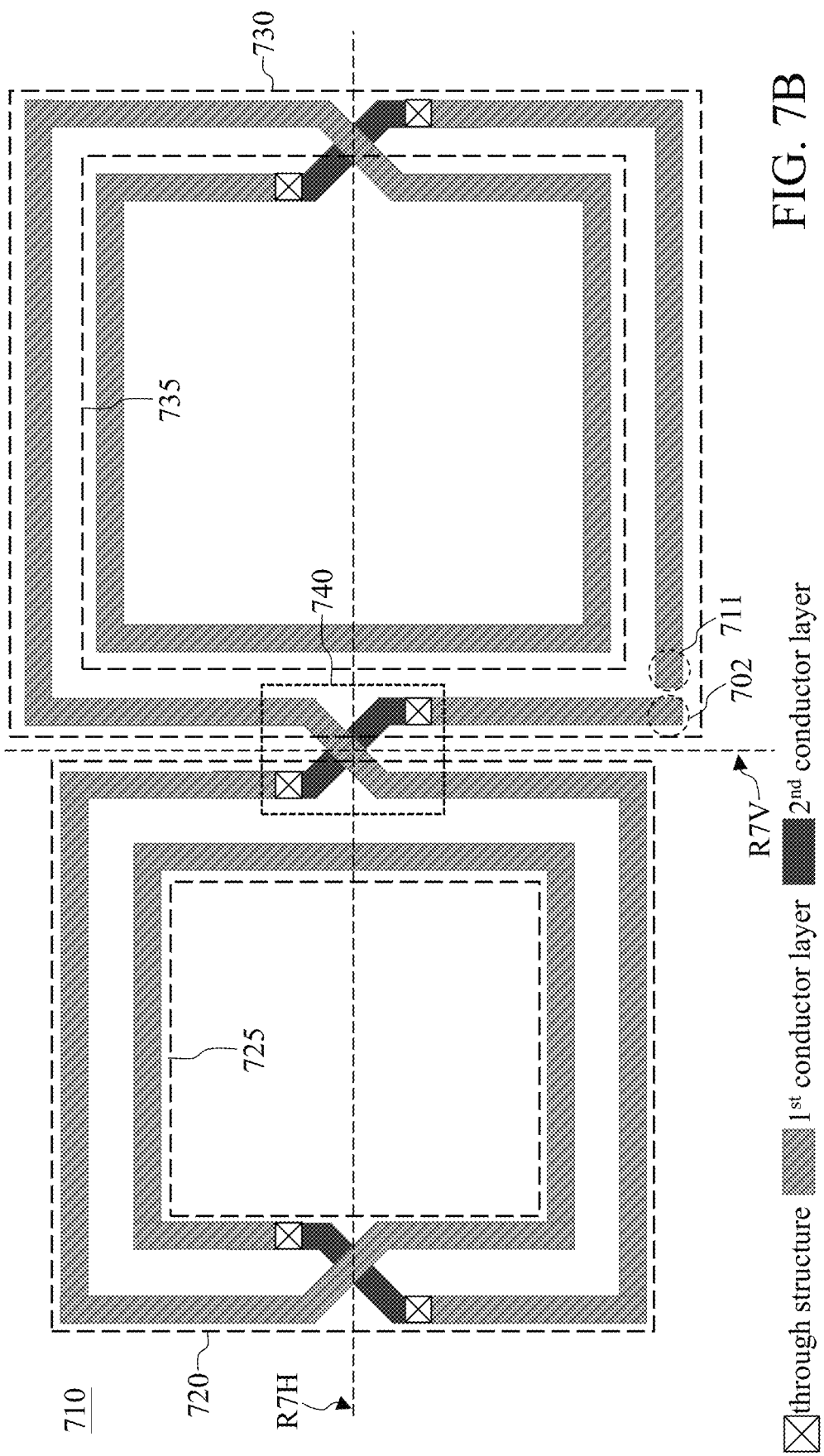
Figure 7C:
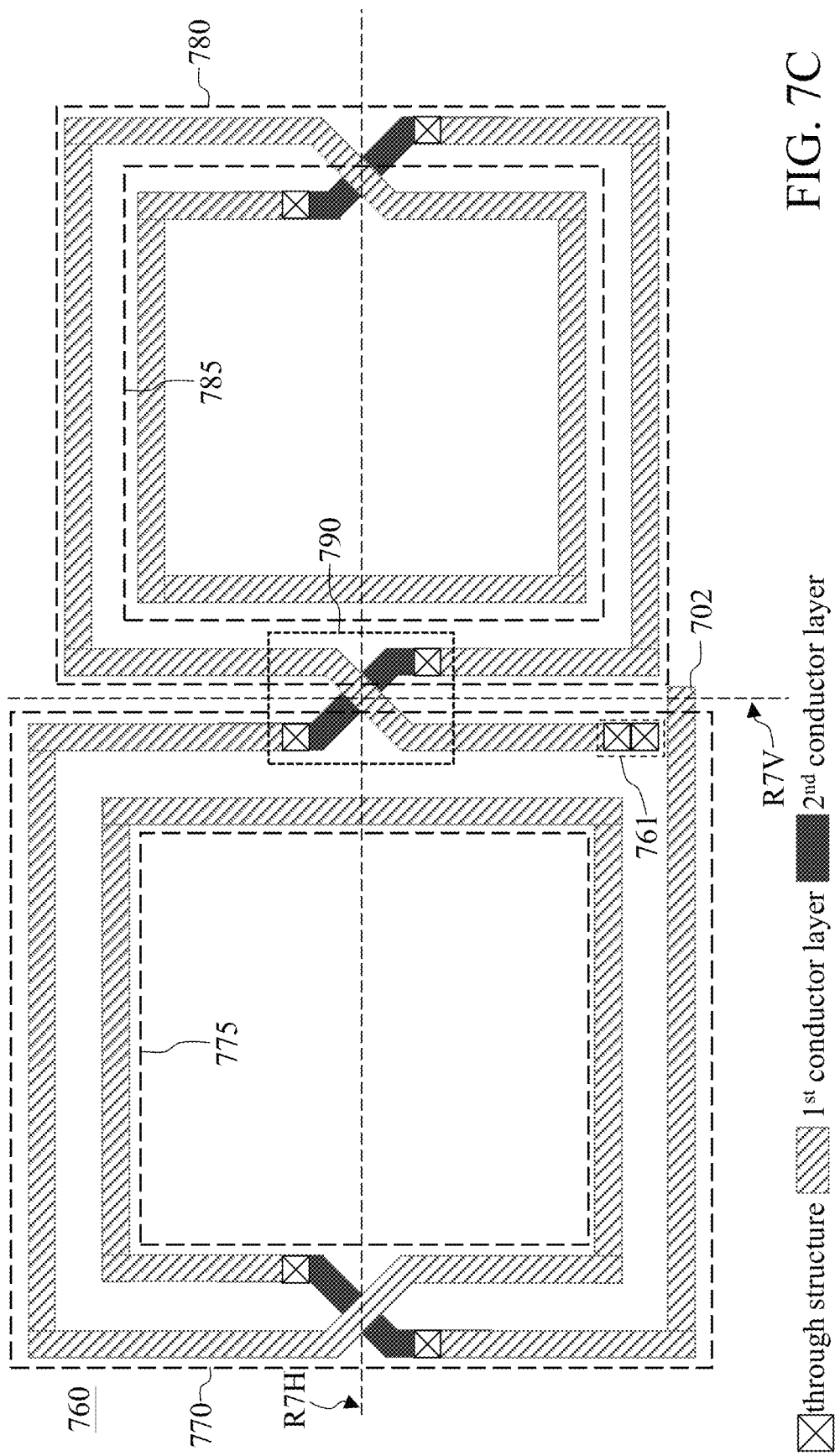

FIGS. 7A to 7C show the structure of an integrated inductor according to another embodiment of the invention. FIG. 7A shows the entire structure of the integrated inductor 700. The integrated inductor 700 is implemented in the first conductor layer and the second conductor layer of a semiconductor structure, and most of the segments or traces of the integrated inductor 700 are implemented in the first conductor layer.

As shown in FIG. 7A, the integrated inductor 700 is of a highly symmetric structure. More specifically, the integrated inductor 700 is substantially symmetric with respect to both the horizontal symmetry axis R7H and the vertical symmetry axis R7V, which are substantially perpendicular to each other. The end 711 and the end 761 are two ends of the integrated inductor 700, and the numeral 702 denotes a node of the integrated inductor 700. After entering the integrated inductor 700 through the end 711, a signal (i.e., current) first passes through the entire winding 710 (as shown in FIG. 7B), through the node 702, through the entire winding 760 (as shown in FIG. 7C), and finally leaves the integrated inductor 700 via the end 761. People having ordinary skill in the art can understand the details of the current path in the integrated inductor 700 from the discussions about the integrated inductor 100, and the details are thus omitted for brevity. In other words, the current direction 751 in the right half of the integrated inductor 700 is different from the current direction 752 in the left half of the integrated inductor 700 (one of which being clockwise and the other counterclockwise).

The integrated inductor 700 can be seen as formed by two windings: the winding 710 (FIG. 7B) and the winding 760 (FIG. 7C). The end 711 and the node 702 are the two ends of the winding 710, and the end 761 and the node 702 are the two ends of the winding 760. In other words, the winding 710 and the winding 760 are connected through the node 702. In some embodiments, the length of the traces between the node 702 and the end 711 is substantially the same as the length of the traces between the node 702 and the end 761. In other words, the total length of the traces of the winding 710 is substantially the same as the total length of the traces of the winding 760. As shown in FIGS. 7B and 7C, because the winding 710 and the winding 760 are substantially equal in length in terms of the traces in the first conductor layer and are substantially equal in length in terms of the traces in the second conductor layer, the winding 710 and the winding 760 are quite symmetric in terms of electrical properties.

The winding 710 includes a coil 720 and a coil 730. The coil 720 and the coil 730 are connected through the crossing structure 740, and the coil 720 and the coil 730 do not overlap. The current direction in the coil 720 is opposite to the current direction in the coil 730. The winding 710 is symmetric with respect to the horizontal symmetry axis R7H but not symmetric with respect to the vertical symmetry axis R7V. The horizontal symmetry axis R7H overlaps the coil 720 and the coil 730, but the vertical symmetry axis R7V does not overlap the coil 720 and the coil 730.

The winding 760 includes a coil 770 and a coil 780. The coil 770 and the coil 780 are connected through the crossing structure 790, and the coil 770 and the coil 780 do not overlap. The current direction in the coil 770 is opposite to the current direction in the coil 780. The current direction in the coil 770 is the same as the current direction in the coil 720, and the current direction in the coil 780 is the same as the current direction in the coil 730. The winding 760 is symmetric with respect to the horizontal symmetry axis R7H but not symmetric with respect to the vertical symmetry axis R7V. The horizontal symmetry axis R7H overlaps the coil 770 and the coil 780, but the vertical symmetry axis R7V does not overlap the coil 770 and the coil 780.

Reference is made to FIGS. 7A, 7B and 7C, the coil 720 and the coil 770 have an overlapping area, and the coil 770 surrounds the coil 720; similarly, the coil 730 and the coil 780 have an overlapping area, and the coil 730 surrounds the coil 780. In other words, the area surrounded or enclosed by the coil 720 (e.g., approximately the area of the dashed box 725) overlaps the area surrounded or enclosed by the coil 770 (e.g., approximately the area of the dashed box 775) Similarly, the area surrounded or enclosed by the coil 730 overlaps the area surrounded or enclosed by the coil 780. The coil 720, the coil 730, the coil 770 and the coil 780 are all of a two-turn structure, making the integrated inductor 700 of a four-turn structure on each side of the vertical symmetry axis R7V. In other embodiments, the coil 720, the coil 730, the coil 770 and the coil 780 may each be a structure of even-numbered turns (four turns, six turns, eight turns, etc.). People having ordinary skill in the art can understand the various embodiments based on the above discussions, so the details of the embodiments of more turns are omitted for brevity.

Reference is made to FIGS. 7A, 7B and 7C. The coil 730 includes a first sub-coil (i.e., the outer turn, formed by the segments outside the dashed box 735) and a second sub-coil (i.e., the inner turn, formed by the segments inside the dashed box 735). The coil 780 includes a third sub-coil (i.e., the outer turn, formed by the segments outside the dashed box 785) and a fourth sub-coil (i.e., the inner turn, formed by the segments inside the dashed box 785). The first sub-coil, the third sub-coil, the second sub-coil and the fourth sub-coil are arranged in sequence from outside to inside. In other words, the sub-coils of the coil 730 and the sub-coils of the coil 780 are interlaced. Similarly, the sub-coils of the coil 720 and the sub-coils of the coil 770 are interlaced.

As shown in FIGS. 7B and 7C, the outer and inner turns of the coil 720 are substantially the same size as the outer and inner turns of the coil 780, respectively, and the outer and inner turns of the coil 730 are substantially the same size as the outer and inner turns of the coil 770, respectively.

As shown in FIG. 7A, the end 711, the end 761 and the node 702 are on the same side of the integrated inductor 700 (i.e., on the lower side of the horizontal symmetry axis R7H), and the node 702 is between the end 711 and the end 761. Furthermore, the end 711 and the end 761 are on different sides of the vertical symmetry axis R7V.

The through structure on the end 761 is for signal (i.e., current) feed-in or feed-out. In other embodiments, a through structure can also be implemented on the end 711 to make the winding 710 and the winding 760 even more symmetric in terms of electrical properties. For more implementation details, please refer to FIG. 3 and its descriptions.

Although the coils in the embodiments discussed above are illustrated in quadrilaterals, this is not a limitation to the present invention. The coils may also be other types of polygons or circles.

Since a person having ordinary skill in the art can appreciate the implementation detail and the modification thereto of the present method invention through the disclosure of the device invention, repeated and redundant description is thus omitted. Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An integrated inductor having a first end, a second end and a node, the integrated inductor comprises:
    a first winding, having two ends which are respectively the first end and the node, and having a first coil and a second coil which do not overlap; and
    a second winding, having two ends which are respectively the second end and the node, and having a third coil and a fourth coil which do not overlap;
    wherein the first coil and the third coil have an overlapping area, and the second coil and the fourth coil have an overlapping area;
    wherein the integrated inductor is substantially symmetric with respect to a symmetry axis which does not overlap the first coil, the second coil, the third coil and the fourth coil, and the first end and the second end are on different sides of the symmetry axis;
    wherein the first end, the second end and the node are on a same side of the integrated inductor, and the node is between the first end and the second end.

2. The integrated inductor of claim 1, wherein the first coil is surrounded by the third coil, and the fourth coil is surrounded by the second coil.

3. The integrated inductor of claim 1, wherein the first coil and the second coil are connected through a first crossing structure, and the third coil and the fourth coil are connected through a second crossing structure.

4. The integrated inductor of claim 1, further comprising:
    an extension segment, connected to the first end and crossing the first coil or the second coil.

5. The integrated inductor of claim 1, further comprising:
    a bridging segment, connecting the first winding and the second winding via a through structure;
    wherein the node is on the bridging segment.

6. The integrated inductor of claim 1, wherein the symmetry axis is a first symmetry axis, the first winding is substantially symmetric with respect to a second symmetry axis, the second winding is substantially symmetric with respect to the second symmetry axis, and the first symmetry axis and the second symmetry axis are substantially perpendicular to each other.

7. The integrated inductor of claim 1, wherein the first coil, the second coil, the third coil and the fourth coil are of single-turn structures.

8. The integrated inductor of claim 1, wherein the first coil, the second coil, the third coil and the fourth coil are of even-numbered turns.

9. The integrated inductor of claim 1, wherein the first coil has a first sub-coil and a second sub-coil, the third coil has a third sub-coil and a fourth sub-coil, and the first sub-coil and the second sub-coil are surrounded by the third sub-coil and the fourth sub-coil.

10. The integrated inductor of claim 1, wherein the first coil has a first sub-coil and a second sub-coil, the third coil has a third sub-coil and a fourth sub-coil, and the first sub-coil, the third sub-coil, the second sub-coil and the fourth sub-coil are arranged in sequence.

11. An integrated inductor having a first end, a second end and a node, the integrated inductor comprising:
    a first winding, having two ends which are respectively the first end and the node, and having a first coil and a second coil which do not overlap; and
    a second winding, having two ends which are respectively the second end and the node, and having a third coil and a fourth coil which do not overlap;
    wherein the first coil and the third coil have an overlapping area, and the second coil and the fourth coil have an overlapping area;
    wherein the first coil is surrounded by the third coil, and the fourth coil is surrounded by the second coil;
    wherein the first end, the second end and the node are on a same side of the integrated inductor, and the node is between the first end and the second end.

12. The integrated inductor of claim 11, wherein the first coil and the second coil are connected through a first crossing structure, and the third coil and the fourth coil are connected through a second crossing structure.

13. The integrated inductor of claim 11, further comprising:
    an extension segment, connected to the first end and crossing the first coil or the second coil.

14. The integrated inductor of claim 11, further comprising:
    a bridging segment, connecting the first winding and the second winding via a through structure;
    wherein the node is on the bridging segment.

15. The integrated inductor of claim 11, wherein the integrated inductor is substantially symmetric with respect to a first symmetry axis, which does not overlap the first coil, the second coil, the third coil and the fourth coil, the first winding is substantially symmetric with respect to a second symmetry axis, the second winding is substantially symmetric with respect to the second symmetry axis, and the first symmetry axis and the second symmetry axis are substantially perpendicular to each other.

16. The integrated inductor of claim 11, wherein the first coil, the second coil, the third coil and the fourth coil are of even-numbered turns.

17. The integrated inductor of claim 11, wherein the first coil has a first sub-coil and a second sub-coil, the third coil has a third sub-coil and a fourth sub-coil, and the first sub-coil and the second sub-coil are surrounded by the third sub-coil and the fourth sub-coil.

18. The integrated inductor of claim 11, wherein the first coil has a first sub-coil and a second sub-coil, the third coil has a third sub-coil and a fourth sub-coil, and the first sub-coil, the third sub-coil, the second sub-coil and the fourth sub-coil are arranged in sequence.

19. An integrated inductor having a first end, a second end and a node, the integrated inductor comprises:
- a first winding, having two ends which are respectively the first end and the node, and having a first coil and a second coil which do not overlap; and
- a second winding, having two ends which are respectively the second end and the node, and having a third coil and a fourth coil which do not overlap;
- wherein the first coil and the third coil have an overlapping area, and the second coil and the fourth coil have an overlapping area;
- wherein the integrated inductor is substantially symmetric with respect to a symmetry axis which does not overlap the first coil, the second coil, the third coil and the fourth coil, and the first end and the second end are on different sides of the symmetry axis;
- wherein the first coil, the second coil, the third coil and the fourth coil are of even-numbered turns.

* * * * *